(12) United States Patent
Akiyama et al.

(10) Patent No.: US 8,210,417 B2
(45) Date of Patent: Jul. 3, 2012

(54) BONDING APPARATUS

(75) Inventors: Naoki Akiyama, Nirasaki (JP); Masahiko Sugiyama, Nirasaki (JP); Hajime Furuya, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/275,866

(22) Filed: Oct. 18, 2011

(65) Prior Publication Data
US 2012/0091186 A1    Apr. 19, 2012

(30) Foreign Application Priority Data
Oct. 18, 2010 (JP) ................................. 2010-233878

(51) Int. Cl.
*B23K 37/04*    (2006.01)
(52) U.S. Cl. ......... 228/6.2; 228/44.7; 228/46; 228/49.1; 228/49.5
(58) Field of Classification Search .................... None
See application file for complete search history.

(56) References Cited

U.S. PATENT DOCUMENTS

| | | | | |
|---|---|---|---|---|
| 4,320,865 A * | 3/1982 | Batinovich | | 228/6.2 |
| 5,436,202 A * | 7/1995 | Miura | | 228/102 |
| 5,555,798 A * | 9/1996 | Miyashita et al. | | 100/318 |
| 6,126,059 A * | 10/2000 | MacKay et al. | | 228/9 |
| 6,666,369 B2 * | 12/2003 | Matsuki et al. | | 228/199 |
| 6,910,613 B2 * | 6/2005 | Narita et al. | | 228/9 |
| 7,357,288 B2 * | 4/2008 | Hosotani et al. | | 228/6.2 |
| 2001/0040029 A1 * | 11/2001 | Davenport et al. | | 165/287 |
| 2002/0100791 A1 * | 8/2002 | Mukuno et al. | | 228/49.5 |
| 2008/0061111 A1 * | 3/2008 | Kiriyama | | 228/47.1 |
| 2008/0179378 A1 * | 7/2008 | Imanishi et al. | | 228/9 |
| 2008/0245472 A1 * | 10/2008 | Hirata et al. | | 156/264 |
| 2009/0173771 A1 * | 7/2009 | Weber | | 228/200 |
| 2011/0214809 A1 * | 9/2011 | Sugiyama | | 156/285 |
| 2011/0263133 A1 * | 10/2011 | Hara et al. | | 438/758 |

FOREIGN PATENT DOCUMENTS

| | | | |
|---|---|---|---|
| JP | 03-163838 A | * | 7/1991 |
| JP | 2004-207436 A | | 7/2004 |
| JP | 2007-158200 A | | 6/2007 |
| JP | 2009-049051 A | | 3/2009 |

* cited by examiner

*Primary Examiner* — Kiley Stoner
(74) *Attorney, Agent, or Firm* — The Nath Law Group; Jerald L. Meyer

(57) ABSTRACT

A bonding apparatus for bonding substrates having metal bonding portions, includes: a processing container having an opening formed on the bottom of the processing container; a thermal treating plate disposed within the processing container, the thermal treating plate allowing for substrates to be mounted thereon and allowing for thermal treatment of the substrates; a pressing mechanism disposed within the processing container opposite the thermal treating plate and which presses the substrates to the thermal treating plate; an annular supporter which is disposed in an inner side of the processing container along the opening of the processing container, the annular supporter providing an airtight seal between the processing container and the thermal treating plate, and supporting the thermal treating plate; and a cooling mechanism which is disposed in an inner side of the supporter below the thermal treating plate, the cooling mechanism cooling the thermal treating plate.

3 Claims, 15 Drawing Sheets

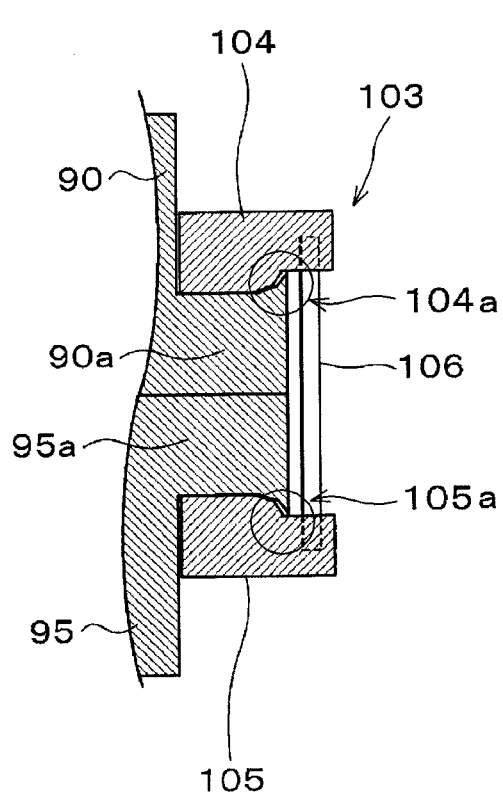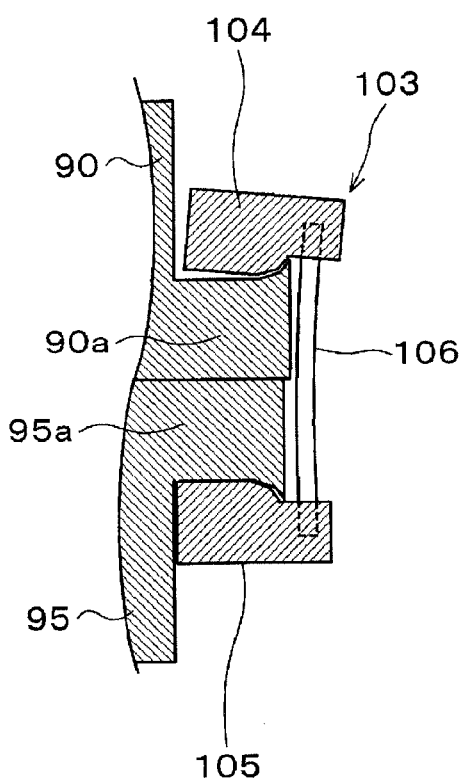

BONDING APPARATUS

CROSS-REFERENCE TO RELATED APPLICATION

This application claims the benefit of Japanese Patent Application No. 2010-233878, filed on Oct. 18, 2010, in the Japanese Patent Office, the disclosure of which is incorporated herein in its entirety by reference.

TECHNICAL FIELD

The present disclosure relates to a bonding apparatus which pressurizes and bonds substrates having metal bonding portions together.

BACKGROUND

In recent years, high integration of semiconductor devices (hereinafter, referred to as "devices") has been promoted. Meanwhile, when a plurality of highly-integrated devices is connected by wires for production, a problem occurs in that an increase in wire length increases wire resistance and wire delay.

To overcome this problem, the use of a three dimensional integration technique has been proposed which stacks semiconductor devices in three dimensions. In the three dimensional integration technique, for example, a bonding apparatus is used to bond two semiconductor wafers (hereinafter, referred to as "wafers") together. The boding apparatus includes, for example, a fixed table on which the wafers are mounted, and a movable table which faces the fixed table and can be elevated with a wafer absorbed on its bottom side. The fixed table and the movable table contain their respective heaters. In the bonding apparatus, the two wafers overlap each other and then are bonded together by the pressure created from the weight of the fixed table and the movable table while being heated by the heaters.

However in some instances when two wafers are bonded together, the bonding portions of metal formed on surfaces of the wafers may be bonded together. In this case, there is a need to pressurize the metal bonding portions while heating them to a predetermined high temperature. In other words, there is a need to sequentially perform a pre-heating step of heating the wafers to a predetermined temperature, a bonding step of pressurizing them while maintaining a predetermined temperature, and a post-heating step of cooling them.

However, in the pre-heating step, since the predetermined temperature is high, the use of the prior art bonding apparatus requires time to heat the wafer to the predetermined temperature. In addition, if the wafers are rapidly heated, since the metal boding portions may not be uniformly heated, there is a need to heat the wafer below a predetermined rate of heating. In addition, since the predetermined temperature is high, it takes time to cool the hot wafers in the post-heating step. Further, if the metal bonding portions are alloyed and bonded together, and the wafers are rapidly cooled, since the strength and physical property of the metal bonding portions may be changed, there is a need to cool the wafers below a predetermined rate of cooling. Moreover, the time taken for the bonding step cannot be shortened since it depends on material or the like used in the metal bonding portions.

As such, in the prior art, it is required to adjust the temperature of the wafer for bonding between the wafers having the metal bonding portions. As a result, it takes a long time to bond the wafers. This results in low production yield in the wafer bonding process.

SUMMARY

According to one embodiment of the present disclosure, there is provided a bonding apparatus for bonding substrates having metal bonding portions, including: a processing container having an opening formed on the bottom of the processing container; a thermal treating plate disposed within the processing container, the thermal treating plate allowing for substrates to be mounted thereon and allowing for thermal treatment of the substrates; a pressing mechanism disposed within the processing container opposite the thermal treating plate and which presses the substrates to the thermal treating plate; an annular supporter disposed in an inner side of the processing container along the opening of the processing container, the annular supporter providing an airtight seal between the processing container and the thermal treating plate, and supporting thermal treating plate; and a cooling mechanism disposed in an inner side of the supporter below the thermal treating plate, the cooling mechanism cooling the thermal treating plate, wherein the cooling mechanism includes a hollow cooling plate having a top disposed in parallel to the thermal treating plate, a communicating pipe which communicates with the inside of the cooling plate and feeds air into the cooling plate, and an elevating mechanism which vertically moves the cooling plate, a plurality of through holes communicating with the inside of the cooling plate is formed in the bottom of the cooling plate, and the air fed from the communicating pipe into the cooling plate is discharged from the through holes of the cooling plate.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 18 is a schematic longitudinal sectional view showing a configuration of the surrounding area of an engagement member.

FIG. 19 is an explanatory view showing a state where the engagement member is bent.

DETAILED DESCRIPTION

Figure 1:
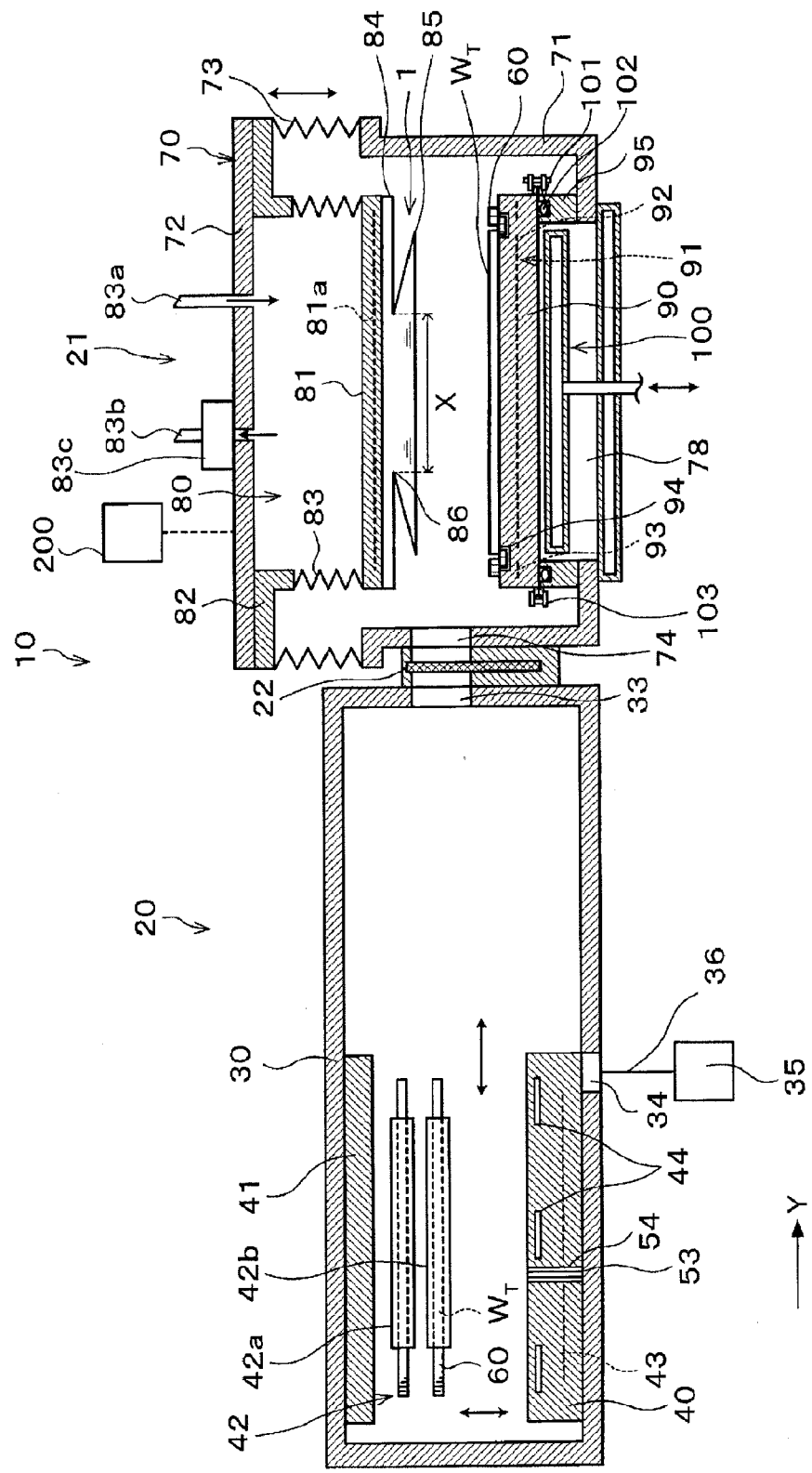
FIG. 1 is a schematic longitudinal sectional view showing a configuration of a bonding apparatus having a pressing adapter.
Figure 2:
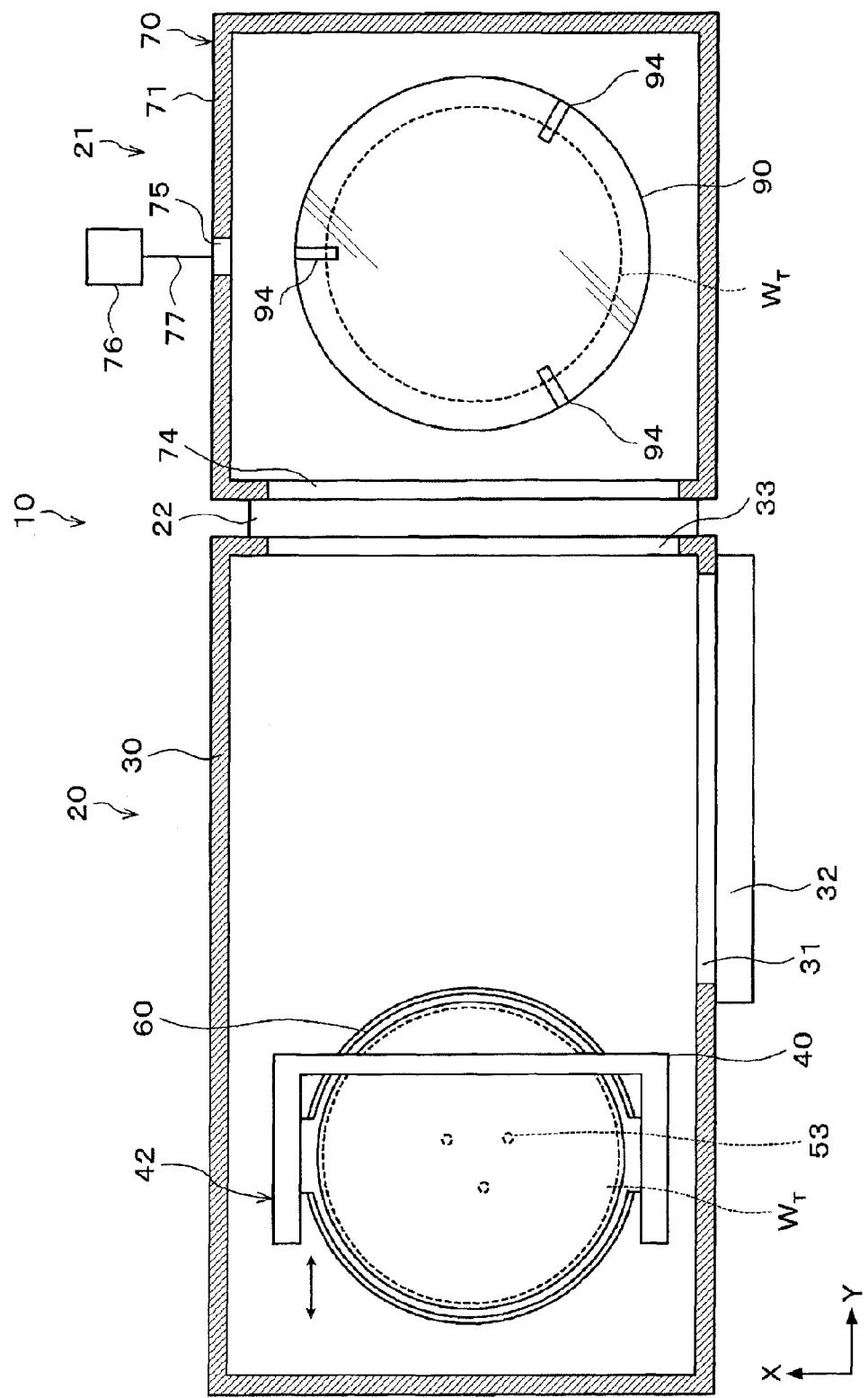
FIG. 2 is a schematic cross sectional view showing a configuration of the bonding apparatus having the pressing adapter.

Embodiments of the present disclosure will now be described in detail with reference to the drawings. FIG. 1 is a schematic longitudinal sectional view showing a configuration of a bonding apparatus 10 having a pressing adapter 1. FIG. 2 is a schematic cross sectional view showing a configuration of the bonding apparatus 10 having the pressing adapter 1.

Figure 3:
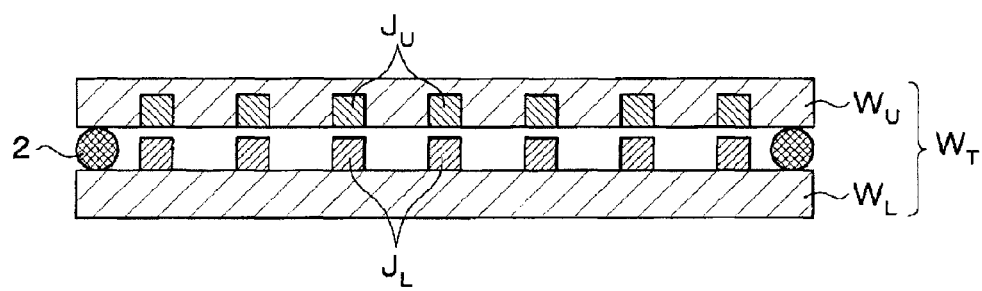
FIG. 3 is a sectional view of overlapping wafers.

In the bonding apparatus 10, for example, wafers $W_U$ and $W_L$ as two substrates are bonded together as shown in FIG. 3. In the following description, a wafer placed on the upper side is sometimes referred to as an "upper wafer $W_U$" and a wafer placed on the lower side is sometimes referred to as a "lower wafer $W_L$." The wafers $W_U$ and $W_L$ have their respective metal bonding portions $J_U$ and $J_L$. An overlapping wafer $W_T$ as an overlapping substrate is formed by overlapping the wafers $W_U$ and $W_L$ with the metal bonding portions $J_U$ and $J_L$ in contact such that the wafers $W_U$ and $W_L$ are bonded together. In addition, in a state before the wafers $W_U$ and $W_L$ are bonded together, an adhesive 2 is applied between the wafers $W_U$ and $W_L$ so that the wafers $W_U$ and $W_L$ can be temporarily bonded together by the adhesive 2, as shown in FIG. 3. Such temporary bonding by the adhesive 2 can prevent the wafers $W_U$ and $W_L$ from being misaligned even when the wafers $W_U$ and $W_L$ are carried after their alignment. In addition, as shown in FIG. 3, when the wafers $W_U$ and $W_L$ are temporarily bonded together, a gap is formed between the metal bonding portions $J_U$ and $J_L$. This causes an atmosphere between the metal bonding portions $J_U$ and $J_L$ to be suctioned at the time of vacuum pumping during bonding, thereby preventing voids from being generated between the metal bonding portions $J_U$ and $J_L$. Further, in this embodiment, the adhesive 2 is vaporized or sublimated by thermal treatment in the bonding. In addition, the metal bonding portions $J_U$ and $J_L$ are made of, for example, aluminum and germanium, respectively.

As shown in FIGS. 1 and 2, the bonding apparatus 10 includes a thermal treatment unit 20 and a bonding unit 21 which are connected serially in a horizontal Y direction. The thermal treatment unit 20 and the bonding unit 21 are airtightly interconnected via a gate valve 22.

The thermal treatment unit 20 includes an internally-airtight processing container 30. An inlet/outlet 31 of the overlapping wafer $W_T$ is formed in the side of the processing container 30, and a gate valve 32 is provided at the inlet/outlet 31. In addition, an inlet/outlet 33 of the overlapping wafer $W_T$ is formed in the side of the processing container 30 facing the bonding unit 21 and the gate value 22 is provided at the inlet/outlet 33.

An air-intake port 34 is formed in the bottom of the processing container 30. The air-intake port 34 is connected to an air-intake pipe 36 communicating with a vacuum pump 35 which reduces the internal atmosphere of the processing container 30 to a predetermined degree of vacuum.

Within the processing container 30 are provided a first thermal treating plate 40 which heats and cools the overlapping wafer $W_T$ mounted thereon, an upper heating means 41 which heats the overlapping wafer $W_T$ mounted in the first thermal treating plate 40 from above, and a carrying mechanism 42 which carries the overlapping wafer $W_T$ along with a carrying ring 60, which will be described later, between the thermal treatment unit 20 and the bonding unit 21. An example of the upper heating means 41 may include a halogen heater, an electric heater or the like which generates radiant heat. As shown in FIG. 1, the first thermal treating plate 40 is embedded with a heater 43 as a heating tool which generates heat by power fed thereto, and a refrigerant passage 44 as a cooling mechanism which cools the thermal treating plate 40 by circulating a refrigerant therein. The refrigerant passage 44 is disposed over the heater 43.

Figure 4:
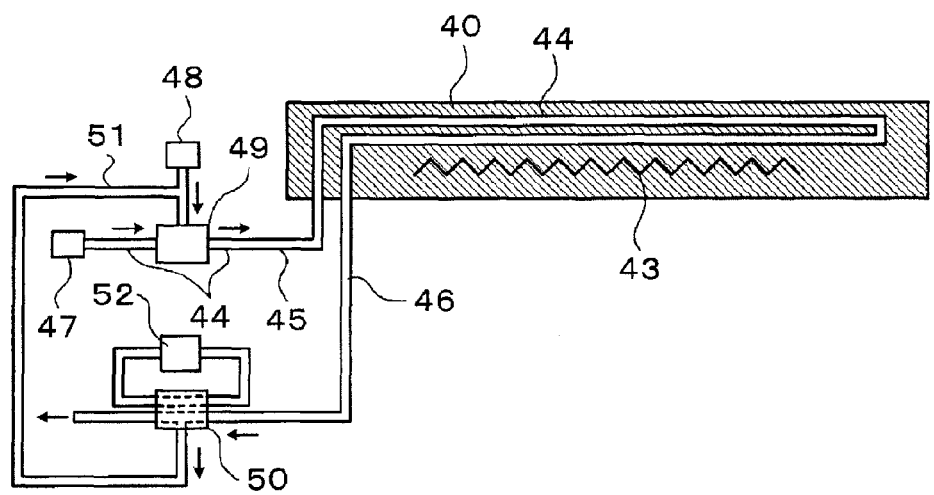
FIG. 4 is a schematic longitudinal sectional view showing a configuration of a first thermal treating plate.

As shown in FIG. 4, the refrigerant passage 44 is connected to a refrigerant feeding pipe 45 which feeds the refrigerant to the refrigerant passage 44, and a refrigerant discharging pipe 46 which discharges the refrigerant from the refrigerant passage 44, respectively. A mixture of dry air and spray-shaped water is used as the refrigerant. The refrigerant feeding pipe 45 is connected to an air source 47 and a cooling water source 48 which feeds dry air and water, acting as the refrigerant, to the refrigerant feeding pipe 45, respectively. A mixer 49 is disposed at a place where the dry air joins the water. When the dry air and the water are mixed by the mixer 49, the water is fogged and fed, as the refrigerant, to the refrigerant passage 44 via the refrigerant feeding pipe 45. The refrigerant discharging pipe 46 is provided with a heat exchanger 50 which cools the refrigerant passed through the refrigerant passage 44. When the refrigerant flowing through the refrigerant discharging pipe 46 is cooled by the heat exchanger 50, the water in the refrigerant is condensed and collected as it drains. The collected draining water is fed upstream of the mixer 49 in the refrigerant feeding pipe 45 via a circulation pipe 51 and is mixed with the dry air by the mixer 49 for reuse as refrigerant. Further, for example, the heat exchanger 50 is connected to a refrigerator 52, as shown in FIG. 4. In addition, heating temperature and cooling temperature of the first thermal treating plate 40 and heating temperature of the upper heating means 41 are controlled by, for example, a control unit 200 which will be described later.

A plurality of (for example, three) elevating pins which elevates the overlapping wafer $W_T$ with the wafers supported from the bottom is disposed below the first thermal treating plate 40. The elevating pins 53 can be vertically moved by an elevation driver (not shown). A plurality of (for example, three) through holes 54 which penetrates the first thermal treating plate 40 in its thickness direction is formed near the central portion of the first thermal treating plate 40. The elevating pins 53 are inserted through the through holes 54 in such a manner that they project from the top of the first thermal treating plate 40.

Figure 5:
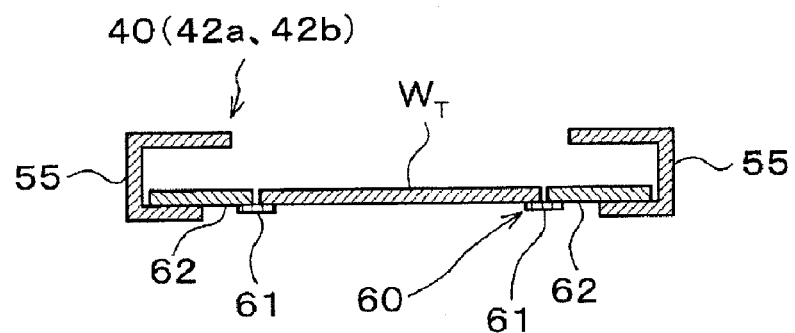
FIG. 5 is a schematic longitudinal sectional view showing a configuration of a carrying mechanism and a carrying ring.
Figure 6:
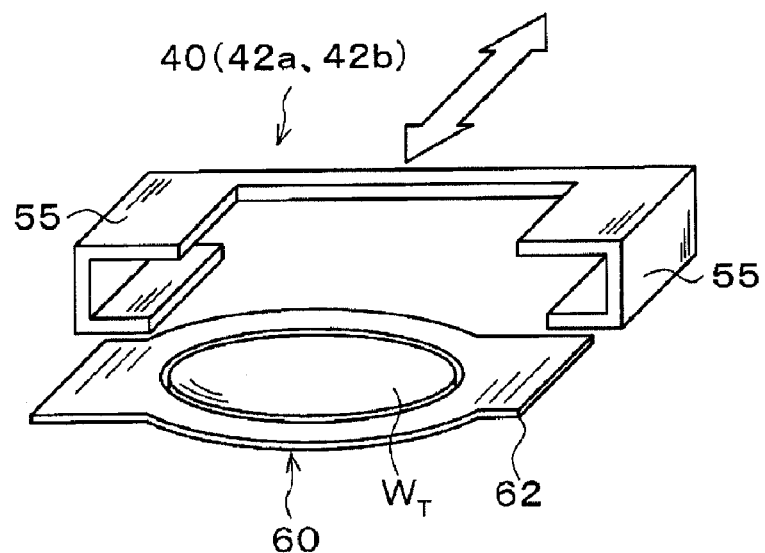
FIG. 6 is a schematic perspective view showing a configuration of the carrying mechanism and the carrying ring.
Figure 7A:
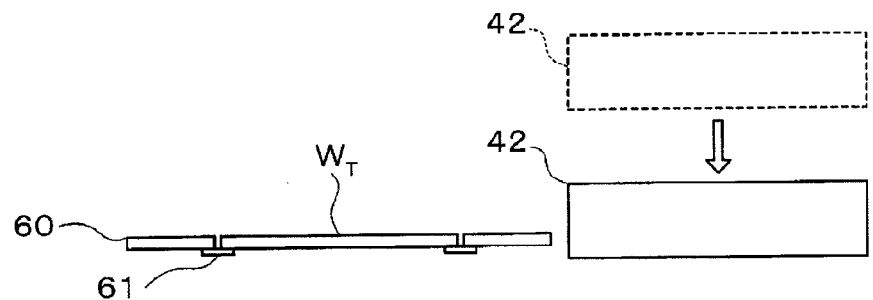
FIG. 7 is an explanatory view showing a state where the carrying ring is held by the carrying mechanism.
Figure 7B:
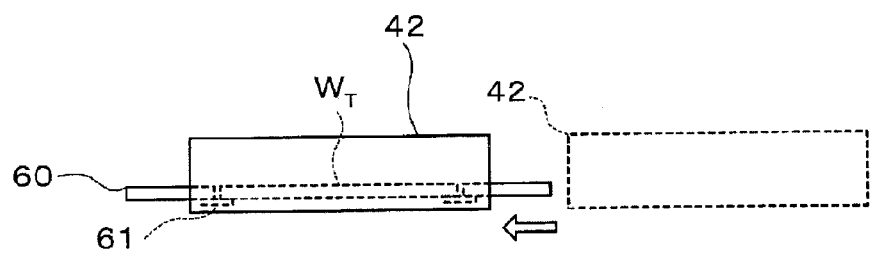
Figure 7C:
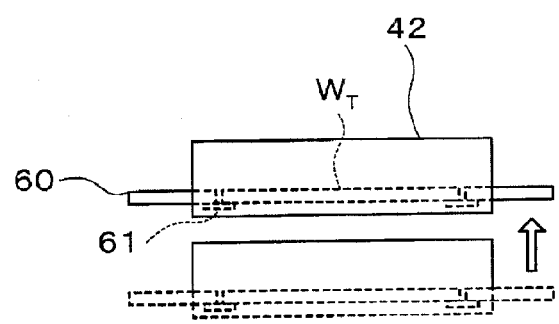

The carrying mechanism 42 includes an upper carrying mechanism 42a and a lower carrying mechanism 42b which are horizontally disposed in a vertical direction, as shown in FIG. 1. The upper carrying mechanism 42a and the lower carrying mechanism 42b have the same shape. The upper carrying mechanism 42a and the lower carrying mechanism 42b are configured to be moved separately in both horizontal and vertical directions by means of a driving mechanism (not shown). Each of the upper carrying mechanism 42a and the lower carrying mechanism 42b includes a pair of holders 55 having a U-like section, with their U-like openings facing each other, as shown in FIGS. 5 and 6. The upper carrying mechanism 42a and the lower carrying mechanism 42b are configured to carry the overlapping wafer $W_T$ along with the carrying ring 60 by holding the carrying ring 60 by means of the holders 55. As shown in FIGS. 5 and 6, the carrying ring 60 has a disc shape opening having a diameter slightly larger than a diameter of the overlapping wafer $W_T$, and a holding member 61 which holds the overlapping wafer $W_T$, as the bottom of the carrying ring 60, in the inner circumference of the opening. As shown in FIG. 6, a pair of projections 62 is formed in the periphery of the carrying ring 60 and is held by the holders 55 of the carrying mechanism 42. In holding the carrying ring 60 by means of the carrying mechanism 42, the carrying mechanism 42 is moved to a height at which the carrying ring 60 is located between the openings of the holders 55, as shown in FIG. 7A, and then the carrying mechanism 42 is further horizontally moved with its height maintained, as shown in FIG. 7B. Thereafter, the carrying mechanism 42 is raised and the projections 62 of the carrying ring 60 are held by the holders 55 so that the carrying ring 60 is held by the carrying mechanism 42, as shown in FIG. 7C.

The bonding unit 21 has an internal-airtight processing container 70. The processing container 70 includes a container body 71 and a top plate 72 connected by a shield bellows 73. The shield bellows 73 can be freely vertically expanded/contracted and the top plate 72 can be freely vertically moved by the shield bellows 73.

An inlet/outlet 74 for the overlapping wafer $W_T$ is formed in the side of the container body 71 at a side of the thermal treatment unit 20 and the above-mentioned gate valve 22 is disposed in the inlet/outlet 74. An air-intake port 75 is formed in the side of the container body 71. An air-intake pipe 77 communicating with a vacuum pump 76 which reduces the internal atmosphere of the processing container 70 to a predetermined degree of vacuum is connected to the air-intake port 75. In this embodiment, the air-intake port 75, the vacuum pump 76 and the air-intake pipe 77 constitute a second decompression mechanism. In addition, for example, in the bottom of the container body 71, a circular bottom opening 78 is formed in which a cooling mechanism 100, which will be described later, is placed.

A pressing mechanism 80 which presses the overlapping wafer $W_T$ on a second thermal treating plate 90, which will be described later, toward the second thermal treating plate 90 is provided in the top plate 72 within the processing container 70. The pressing mechanism 80 includes a pressing member 81 which presses the overlapping wafer $W_T$ via the pressing adapter 1, an annular supporting member 82 attached to the top plate 72, and a pressing bellows 83 which connects the pressing member 81 with the supporting member 82 and can be freely vertically expanded/contacted. A diameter of the pressing member 81 is made larger than the diameter of the overlapping wafer $W_T$. The pressing bellows 83 is provided with an air feeding pipe 83a which feeds, for example, compressed air to the inside of the pressing mechanism 80, that is, an inner space surrounded by the pressing member 81, the pressing bellows 83, the supporting member 82 and the top plate 72, and an air discharging pipe 83b which discharges air fed to the inner space. Accordingly, by feeding the compressed air to the inner space of the pressing mechanism 80 via the air feeding pipe 83a, the pressing bellows 83 can be expanded/contracted so that the pressing member 81 can be freely vertically moved. The air discharging pipe 83b is provided with a cooling jacket 83c which cools air circulated in and discharged from the air discharging pipe 83b. The cooling jacket 83c may be, for example, a water cooling heat exchanger having the shape of a shell or tube. The air discharging pipe 83b is also provided with a regulating mechanism (not shown) which regulates the amount of air discharged from the air discharging pipe 83b. Accordingly, by regulating the amount and pressure of feed of the compressed air fed by the air feeding pipe 83a and the amount of air discharged from the air discharging pipe 83b, the internal pressure of the pressing bellows 83 can be adjusted to a desired pressure while discharging the compressed air from the air discharging pipe 83b. In other words, the internal pressure of the pressing bellows 83 and the amount of compressed air circulated in the pressing bellows 83 can be separately controlled. In addition, a heater 81a which generates heat by feed of power is embedded in the pressing member 81, and thus, by regulating the amount of compressed air fed to the pressing bellows 83, the amount of heat emitted from the heater 81a to the compressed air within the pressing bellows 83 can be adjusted. Accordingly, by regulating the flow rate of compressed air fed into the pressing bellows 83 and the temperature of the heater 81a, the temperature of the pressing adapter 1 can be adjusted to a desired temperature through heat transfer by the pressing member 81. In addition, since the compressed air is sealed within the pressing mechanism 80, the pressing bellows 83 of the pressing mechanism 80 is made more rigid than the shield bellows 73 of the processing container 70 so that the pressing bellows 83 can endure its internal pressure caused by the compressed air.

The pressing adapter 1 is connected to the bottom of the pressing member 81. The pressing adapter 1 uses the pressing member 81 having a diameter larger than the diameter of the overlapping wafer $W_T$ and is provided to press the overlapping wafer $W_T$ with a uniform in-plane load. As shown in FIG. 1, the pressing adapter 1 includes a disc-like upper adapter 84 and a conical trapezoid-like lower adapter 85 which are integrated. The upper adapter 84 and the lower adapter 85 are concentrically arranged when viewed from the top. In addition, the bottom side of the conical trapezoid-like lower adapter 85 has the same diameter as the overlapping wafer $W_T$ and a diameter of the top side of the lower adapter 85 is smaller than the diameter of the upper adapter such that the pressing adapter 1 has a narrow portion 86 in the middle.

Figure 8:
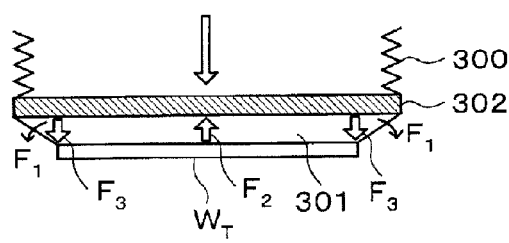
FIG. 8 is a schematic longitudinal sectional view showing a bonding method.
Figure 22:
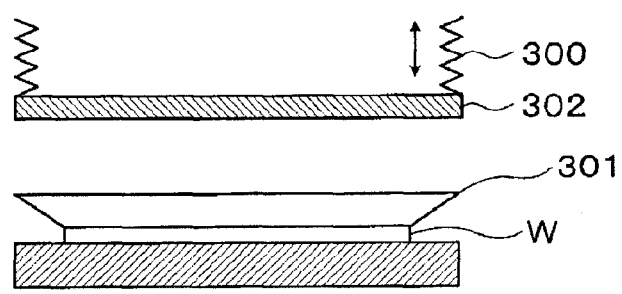
FIG. 22 is a schematic longitudinal sectional view showing a conventional bonding method.

The shape of the pressing adapter 1 will be now described in more detail. As described above, the inventors have observed that, even when a conical trapezoid-like adapter 301 shown in FIG. 22 is arranged with its trapezoidal top side directed downward and a pressing member 302 having a diameter larger than that of a wafer W presses the wafer W via the adapter 301 having a diameter different from that of the wafer W, a load is still concentrated on the circumference of the overlapping wafer $W_T$. The inventors have verified this observation and have found that, when the adapter 301 is used to press the overlapping wafer $W_T$, a stress $F_1$ is applied to the outer circumference of the adapter 301, for example as shown in FIG. 8, such that the adapter 301 is bent, and accordingly an upward stress $F_2$ is concentrated near the center of the adapter 301 while a downward stress $F_3$ is concentrated on the outer circumference of the adapter 301, thereby making it impossible to obtain a uniform in-plane load when the overlapping wafer $W_T$ is pressed.

Figure 9:
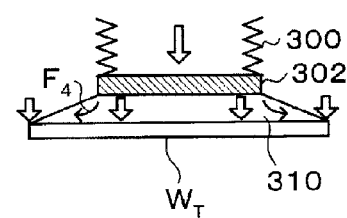
FIG. 9 is a schematic longitudinal sectional view showing a bonding method.

In this regard, the inventors have observed that, even when a conical trapezoid-like adapter is used like the adapter 301, for example when a conical trapezoid-like adapter 310 is arranged with its top side directed upward, as shown in FIG. 9, a stress $F_4$ exerted on the adapter 310 is distributed to its bottom side, thereby concentrating the stress on the circumference of the adapter 310. However, in comparison of the adapter 310 and the adapter 301, since an area of the top side of the adapter 310 is smaller than an area of the top side of the adapter 301, in order to obtain a pressing load from the adapter 310, there is a need to further increase a pressure of pressing air fed to a bellows 300 as compared with the adapter 301, which may cause a trouble in terms of air source.

Therefore, the inventors have believed that a shape such as the pressing adapter 1 including the disc-like upper adapter 84, the conical trapezoid-like lower adapter 85 and the narrow portion 86 in the middle between the upper adapter 84 and the lower adapter 85 is effective in obtaining a uniform in-plane load when pressing the overlapping wafer $W_T$ while increasing a contact area between the pressing bellows and the adapter. In addition, it has been observed by experiment that, as a result of pressing the overlapping wafer $W_T$ while varying dimensions of the upper adapter 84 and the lower adapter 85, the overlapping wafer $W_T$ can be satisfactorily pressed if a ratio of the diameter of the narrow portion 86 to the diameter of the overlapping wafer $W_T$ is 0.7:1 to 1:1.

The experiment carried out by the inventors will be described below. In bonding the overlapping wafer $W_T$ using the pressing adapter 1, a test on a load exerted on a plane of the overlapping wafer $W_T$ was performed while changing an elasticity modulus of material of the pressing adapter 1, the diameter of the upper adapter 84, the diameter of the lower adapter 85 and the diameter of the overlapping wafer $W_T$. In such a case, the heating temperature of the first thermal treating plate 40 and the upper heating means 41 was set to 350 degrees Celsius and the heating temperature of the second thermal treating plate 90, which will be described later, was set to 430 degrees Celsius. In addition, a halogen heater was used as the upper heating means 41.

The pressing adapter 1 was configured such that the diameter of the upper adapter 84 is 350 mm, the diameter of the overlapping wafer $W_T$ and the diameter of the bottom side of the lower adapter 85 are 200 mm, the height of the pressing adapter 1, in other words, a distance from the top side of the upper adapter 84 to the bottom side of the lower adapter 85, is 35 mm, and the height from the bottom side of the lower adapter 85 to the narrow portion 86, in other words, a distance from the bottom side of the lower adapter 85 to its top side, is 19 mm. In addition, material of the pressing adapter 1 was stainless steel having an elasticity modulus of 200 GPa, silicon carbide(SiC) having an elasticity modulus of 410 GPa, and cemented carbide having an elasticity modulus of 620 GPa. When the diameter X of the narrow portion 86 in the pressing adapter 1 made of the above-mentioned material was changed from 100 mm to 200 mm, a difference between the maximum stress and the minimum stress applied to the plane of the overlapping wafer $W_T$, i.e., the maximum stress difference, was observed. A result of the observation is shown in FIG. 10.

Figure 10:
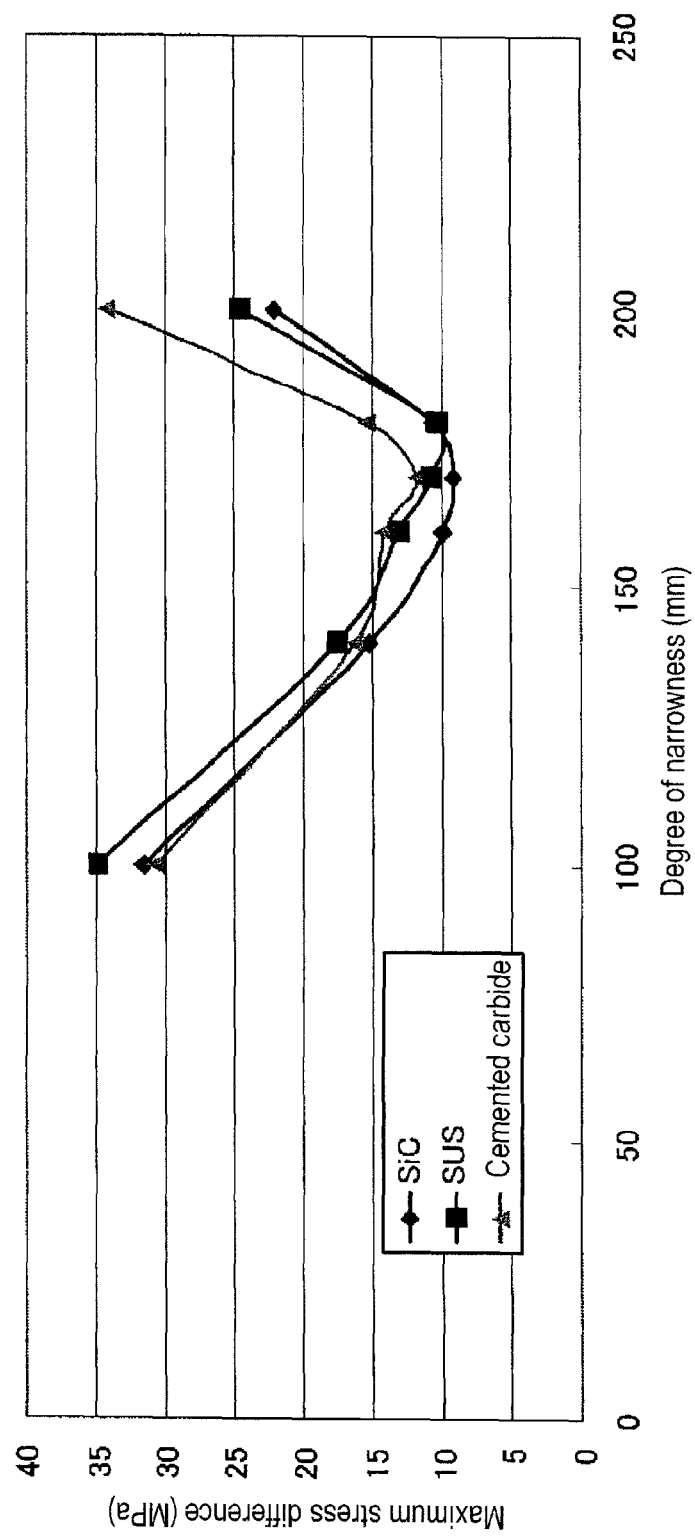
FIG. 10 is a graph showing a relationship between material and degree of narrowness of a pressing adapter, and the maximum stress difference.

FIG. 10 shows a relationship between the diameter X of the narrow portion 86 as a degree of narrowness (represented by a horizontal axis) and the maximum stress difference (represented by a vertical axis) when the pressing adapter 1 having different elasticity moduli was used to press the overlapping wafer $W_T$. As shown in FIG. 10, when the degree of narrowness was set to 160 mm to 180 mm, it was observed that the maximum stress difference in each pressing adapter 1 is minimal irrespective of the elasticity modulus of the pressing adapter 1. From this observation, the existence of an optimal value in the degree of narrowness of the pressing adapter 1 was observed and this optimal degree of narrowness does not depend on the elasticity modulus of the material of the pressing adapter 1.

Next, in the pressing adapter 1 made of silicon nitride having the elasticity modulus of 410 GPa, when the diameter of the upper adapter 84 was 350 mm and the diameter of the overlapping wafer $W_T$ and the diameter of the bottom side of the lower adapter 85 were 300 mm, when the diameter of the upper adapter 84 was 525 mm and the diameter of the overlapping wafer $W_T$ and the diameter of the bottom side of the lower adapter 85 were 300 mm, and when the diameter of the upper adapter 84 was 350 mm and the diameter of the overlapping wafer $W_T$ and the diameter of the bottom side of the lower adapter 85 were 200 mm, a maximum stress difference in the plane of the overlapping wafer $W_T$ while varying the degree of narrowness of each pressing adapter 1 was observed. A result of the observation is shown in FIG. 11.

Figure 11:
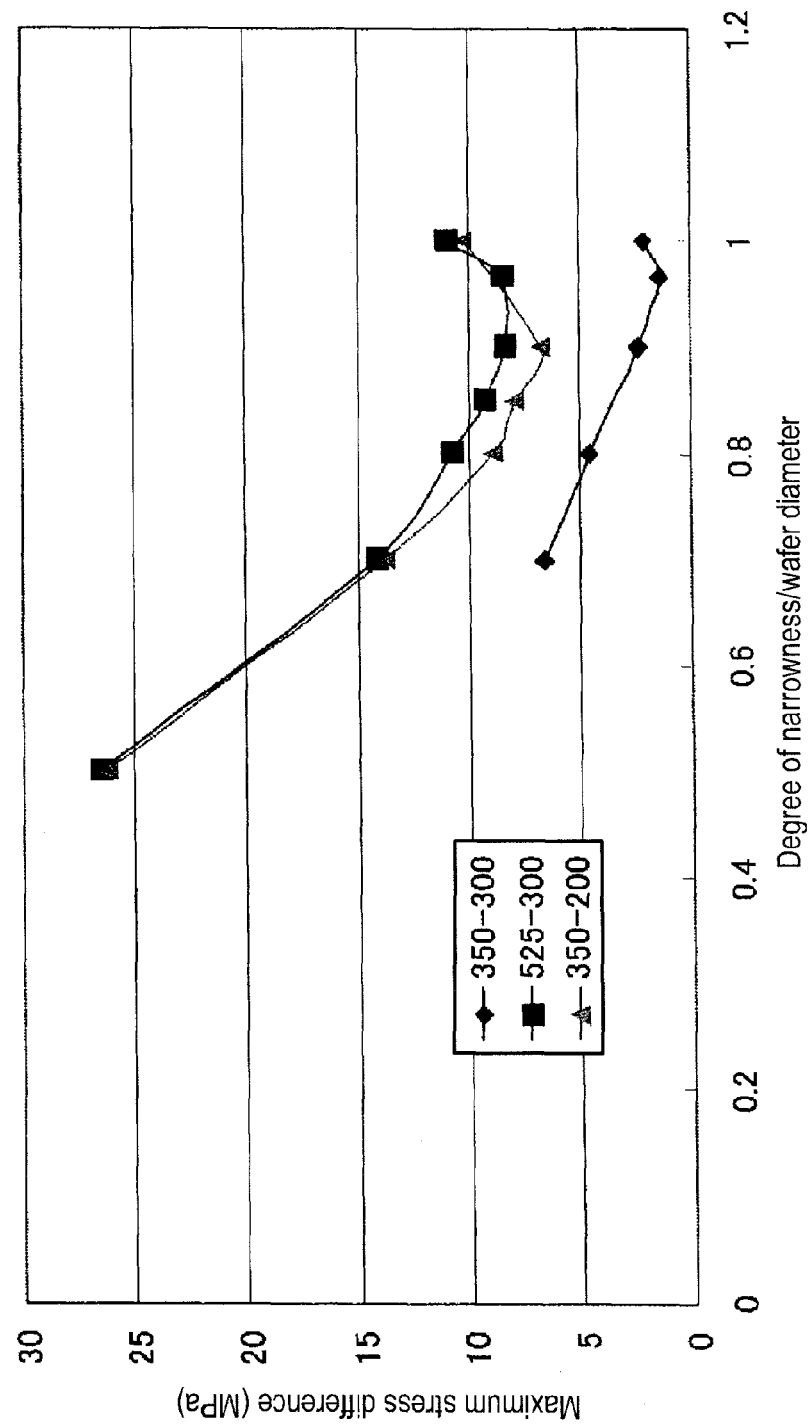
FIG. 11 is a graph showing a relationship between wafer diameter, degree of narrowness of a pressing adapter, and the maximum stress difference.

FIG. 11 shows a relationship between a ratio of the degree of narrowness to the diameter of the overlapping wafer $W_T$ (the diameter of the bottom side of the lower adapter 85) (represented by a horizontal axis) and the maximum stress difference (represented by a vertical axis) when the overlapping wafer $W_T$ is pressed by each pressing adapter 1. As shown in FIG. 11, when the ratio of the degree of narrowness to the diameter of the overlapping wafer $W_T$ was set to about 0.7:1 to 1:1, it was observed that the maximum stress difference in each pressing adapter 1 is minimal irrespective of the diameter of the upper adapter 84 and the diameter of the bottom side of the lower adapter 85. As a result, from the results shown in FIGS. 10 and 11, it can be seen that the maximum stress difference in the plane of the overlapping wafer $W_T$ can be minimal by setting the ratio of the degree of narrowness to the diameter of the bottom side of the lower adapter 85 to a proper value irrespective of the elasticity modulus of the material of the pressing adapter 1, the diameter of the upper adapter 84 and the diameter of the bottom side of the lower adapter 85.

If the maximum stress difference in the plane of the overlapping wafer $W_T$ is within 15 MPa, it may be determined that the wafer is pressed with a uniform load. Accordingly, in order to press the overlapping wafer $W_T$ with a uniform load using the pressing member 81 having a diameter larger than that of the overlapping wafer $W_T$, the ratio of the degree of narrowness of the pressing adapter 1, that is, the diameter of the narrow portion 86, to the diameter of the bottom side of the lower adapter 85 may be 0.7:1 to 1:1 in some embodiments, and may also be 0.8:1 to 0.9:1 in other embodiments.

Figure 12:
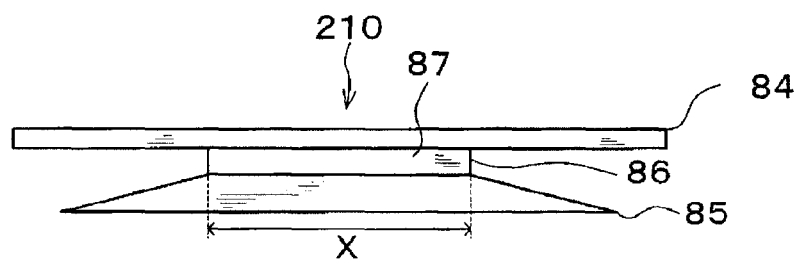
FIG. 12 is a side view showing another pressing adapter.
Figure 13:
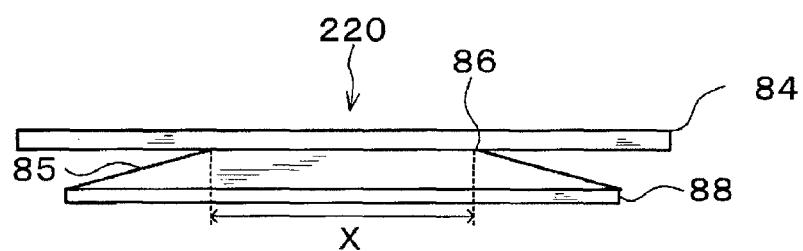
FIG. 13 is a side view showing another pressing adapter.
Figure 14:
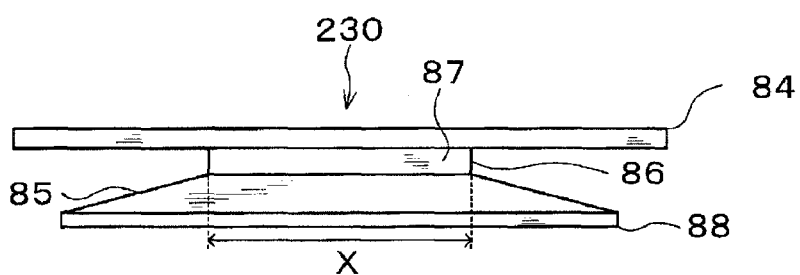
FIG. 14 is a side view showing another pressing adapter.

Although the pressing adapter 1 including the upper adapter 84, the lower adapter 85, which are integrated, and the narrow portion 86 was used in the above test, the shape of the pressing adapter 1 is not limited to the above embodiment. Instead of the pressing adapter 1, the inventors have found that a pressing adapter 210 having a cylindrical connector 87 may be used to form the narrow portion 86 in the middle between the upper adapter 84 and the lower adapter 85, as shown in FIG. 12, or a pressing adapter 220 including a disc portion 88 having the same diameter as the diameter of the bottom side of the lower adapter 85 and integrated with the lower portion of the lower adapter 85 may be used to form the narrow portion 86, as shown in FIG. 13. In addition, as shown in FIG. 14, an adapter 230 including both of the connector 87 and the disc portion 88 may be used. Any adapter can be used to uniformly apply a uniform load on a large area to a small area.

Figure 15:
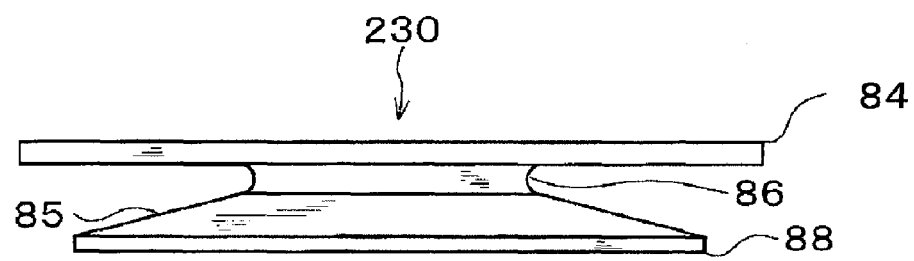
FIG. 15 is a side view showing another pressing adapter.

Although in this embodiment the narrow portion 86 is formed at an acute angle or a right angle, the narrow portion 86 may be formed in a spherical shape having a predetermined curvature. Using the adapter 230 as an example, the narrow portion 86 may be formed in a semi-circular shape by indenting the circumference of the connector 87 inwardly, as shown in FIG. 15. In this case, as a stress due to a pressing load is concentrated on the narrow portion 86, the narrow portion 86 of each of the pressing adapters 1, 210, 220 and 230 can be prevented from being damaged.

Figure 16:
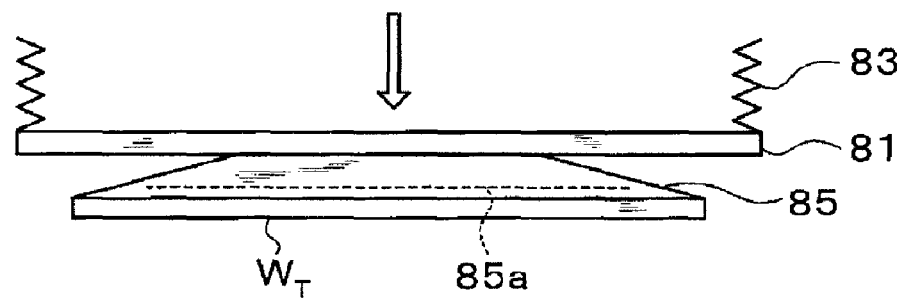
FIG. 16 is a side view showing another pressing adapter.

In addition, although the pressing adapter in the above embodiment is separated from the pressing member 81 of the pressing mechanism 80, the pressing member 81 and the pressing adapter may be integrated. Specifically, for example, as shown in FIG. 16, only a portion of the lower adapter 85 of the pressing adapter 1 may be bonded to the lower side of the pressing member 81. In this case, instead of the heater 81a embedded in the pressing member 81, a heater 85a may be embedded in the lower adapter 85. When the heater 85a is embedded in the lower adapter 85, since there is no need to consider heat capacity of the pressing adapter 1 interposed between the heater 81a and the overlapping wafer $W_T$, it is possible to control the temperature of the overlapping wafer $W_T$ with higher precision and shorten the time required to heat the overlapping wafer $W_T$. Further, since no loss in heat transfer occurs in a contact surface between the pressing member 81 and the pressing adapter 1 by integrating the pressing adapter 1 with the pressing member 81, the efficiency of heat transfer in the contact surface between the pressing member 81 and the pressing adapter 1 can be improved. In addition, although the integration of the pressing member 81 with the pressing adapter 1 is shown in FIG. 16, the pressing member 81 may be integrated with other pressing adapters 210, 220 and 230.

Next, the second thermal treating plate 90 will be described. As shown in FIG. 1, the second thermal treating plate 90 as a mounting unit which mounts and heats the overlapping wafer $W_T$ is disposed at a position facing the pressing mechanism 80 below the pressing mechanism 80 within the processing container 70. A heater 91 which generates heat by feed of power is embedded in the second thermal treating plate 90. The second thermal treating plate 90 is made of, for example, ceramics such as aluminum nitride. The heater 91 includes an inner circumferential heater 92 embedded in a position corresponding to the overlapping wafer $W_T$ and an outer circumferential heater 93 which is concentrically disposed in the outside of the inner circumferential heater 92 and is temperature-controllable independent of the inner circumferential heater 92. The heating temperature of the inner and outer circumferential heaters 92 and 93 is controlled by the control unit 200 which will be described later. In addition, as shown in FIG. 1, cut-out grooves 94 which accommodate the holding member 61 of the carrying ring 60 carried by the carrying mechanism 42 are formed in the outer circumference of the second thermal treating plate 90. As shown in FIG. 2, three cut-out grooves 94 in circumferential portions of the second thermal treating plate 90 are formed in positions corresponding to the holding member 61 of the carrying ring 60.

Figure 17:
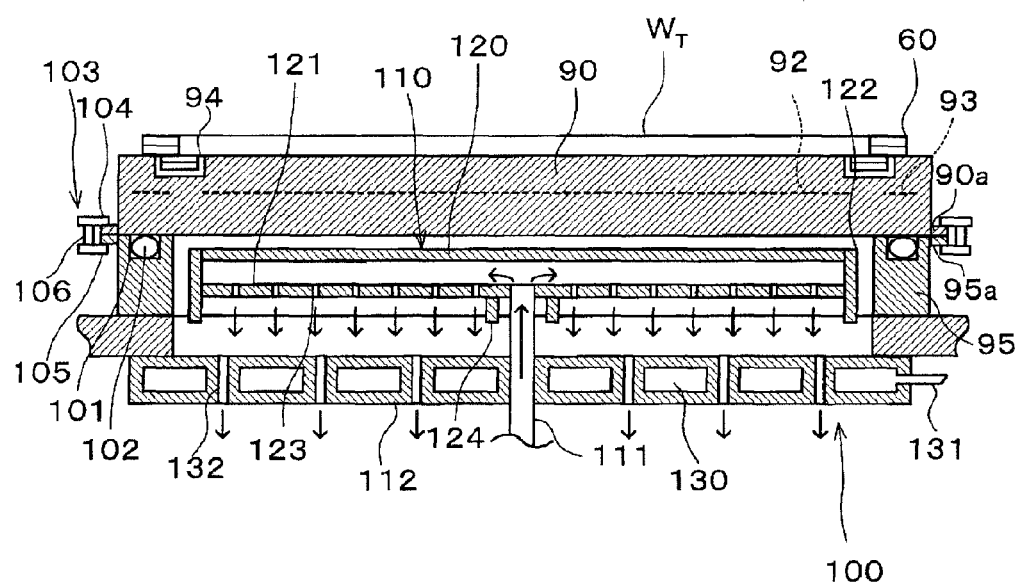
FIG. 17 is a schematic longitudinal sectional view showing a configuration of the surrounding area of a cooling mechanism.

As shown in FIGS. 1 and 17, the outer circumference of the second thermal treating plate 90 is supported by the top of an annular supporter 95 provided along the bottom opening 78 of the container body 71 as an inner surface of the container body 71. Accordingly, the bottom of the second thermal treating plate 90 is exposed to the outside of the processing container 70 via the bottom opening 78. The cooling mechanism 100 which cools the overlapping wafer $W_T$ is disposed at a side of the bottom of the second thermal treating plate 90, in other words, in the outside of the processing container 70. The supporter 95 is a substantially cylindrical member which prevents heat from the second thermal treating plate 90 from being transferred to the container body 71 and is made of, for example, adiabatic ceramics such as silicon nitride. A concaved groove 101 is concentrically formed with the second thermal treating plate 90 in a surface of the supporter 95 facing the second thermal treating plate 90. A seal member 102 is arranged within the groove 101 to provide an airtight seal between the supporter 95 and the second thermal treating plate 90. The seal member 102 is formed of, for example, a heat-resistant metal O-ring.

Flanges 90a and 95a are formed in outer circumferences of the second thermal treating plate 90 and the supporter 95, respectively, as shown in FIGS. 17 and 18. The flanges 90a and 95a are held by an engagement member 103 so that a force is exerted in a direction in which they press the seal member 102. As shown in FIGS. 17 and 18, the engagement member 103 includes an upper engagement portion 104 which is in contact with the flange 90a, a lower engagement portion 105 in contact with the flange 95a, and a connecting portion 106 connecting the upper engagement portion 104 with the lower engagement portion 105. The connecting portion 106 is, for example, a male screw having a thread and is combined with a nut (not shown) formed in the lower engagement portion 105 in order to exert a force in a direction in which the upper engagement portion 104 and the lower engagement portion 105 press the seal member 102, so that the processing container 70 can be made airtight. The upper engagement portion 104, the lower engagement portion 105 and the connecting portion 106 are made of, for example, metal material such as stainless steel having strength and elasticity required for the engagement member. Since elastic material is used for the connecting portion 106, when the second thermal treating plate 90 is heated by the heater 91 and a difference in thermal expansion occurs between the second thermal treating plate 90 and the supporter 95, the connecting portion 106 is bent, for example as shown in FIG. 19, thereby preventing the engagement member 103 from being damaged and providing an airtight seal between the second thermal treating plate 90 and the supporter 95. In addition, as shown in FIG. 18, a claw 104a projecting toward the top of the flange 90a is formed in the upper engagement portion 104 and a claw 105a projecting toward the bottom of the flange 95a is formed in the lower engagement portion 105. Therefore, as shown in FIG. 19, even when the connecting portion 106 is bent, the engagement member 103 can be prevented from being separated from the flange portions 90a and 95a.

As shown in FIG. 17, the cooling mechanism 100 includes a hollow disc-like cooling plate 110 which is disposed in parallel to the second thermal treating plate 90, a communicating pipe 111 which vertically extends to communicate with the hollow portion of the cooling plate 110, and a cooling water circulating plate 112 which is disposed below the cooling plate 110 in parallel to the cooling plate 110. The cooling plate 110, the communicating pipe 111 and the cooling water circulating plate 112 are made of, for example, a copper alloy having excellent thermal conductivity.

The cooling plate 110 includes a contact portion 120 which is disposed in parallel to the back side of the thermal treating plate 90 and cools the thermal treating plate 90 by contacting the back side of the thermal treating plate 90, a heat radiating portion 121 which is disposed in parallel to the contact portion 120 and has through holes arranged with a predetermined interval, and a circumferential portion 122 which surrounds the contact portion 120 and the heat radiating portion 121. The heat radiating portion 121 has a plurality of through holes 123 which is formed in a predetermined pattern and communicates with the inside of the cooling plate 110. The communicating pipe 111 communicates with the center of the heat radiating portion 121. In addition, the communicating pipe 111 is inserted through the cooling water circulating plate 112 and can be freely slid with respect to the cooling water circulating plate 112. Thus, the cooling plate 110 can be vertically moved by vertically moving the communicating pipe 111 by means of an elevating mechanism (not shown).

An air source (not shown) which feeds air as a refrigerant to the cooling plate 110 is connected to the communicating pipe 111. The air fed into the hollow portion of the cooling plate 110 via the communicating pipe 111 is discharged from the through holes 123 of the heat radiating portion 121.

A convex projection 124 projecting downward is formed in the bottom of the heat radiating portion 121. The circumferential portion 122 extends to the same position as a leading end of the projection 124. Therefore, when the cooling plate 110 is descended, a space surrounded by the projection 124, the circumferential portion 122 and the cooling water circulating plate 112 can be formed.

As shown in FIG. 17, a cooling water passage 130 which circulates cooling water in the cooling water circulating plate 112 is formed in the cooling water circulating plate 112. A cooling water pipe 131 which feeds cooling water from a cooling water source (not shown) to the cooling water passage 130 is connected to the cooling water passage 130. In addition, through holes 132 are formed in a predetermined pattern in the cooling water circulating plate 112, like the heat radiating portion 121, and air as a refrigerant discharged from the heat radiating portion 121 can be discharged out of the cooling mechanism 100. Accordingly, the cooling mechanism 100 can cool the cooling plate 110 by feeding air as a refrigerant into the cooling plate 110 via the communicating pipe 111 and the cooling plate 110 can cool the thermal treating plate 90 by elevating the communicating pipe 111 by means of the elevating mechanism (not shown) and contacting the cooling plate 110 to the bottom of the second thermal treating plate 90. At this time, by cooling the cooling water circulating plate 112 with cooling water fed into the cooling water passage 130 of the cooling water circulating plate 112, the air passing through the through holes 132 can be cooled, thereby preventing hot air from being discharged out of the cooling mechanism 100. Further, by lowering the communicating pipe 111 and contacting the cooling water circulating plate 112 to the projection 124 formed in the bottom of the heat radiating portion 121, the cooling plate 110 can be cooled with high efficiency, along with air fed into the communicating pipe 111.

As shown in FIG. 1, the bonding apparatus 10 has the control unit 200. The control unit 200 is, for example, a computer and includes a program storage (not shown). The program storage stores a program which controls processing of the overlapping wafer $W_T$ in the bonding apparatus 10. The program storage also stores a program which controls operation of a driving system including the above-described processing devices and carrying device to implement a bonding process in a bonding system 1, which will be described below. The programs may be installed in the control unit 200 from a computer readable storage medium H such as, for example, a hard disk (HD), a flexible disk (FD), a compact disk (CD), a magneto-optical disk (MO), a memory card or the like.

Figure 20:
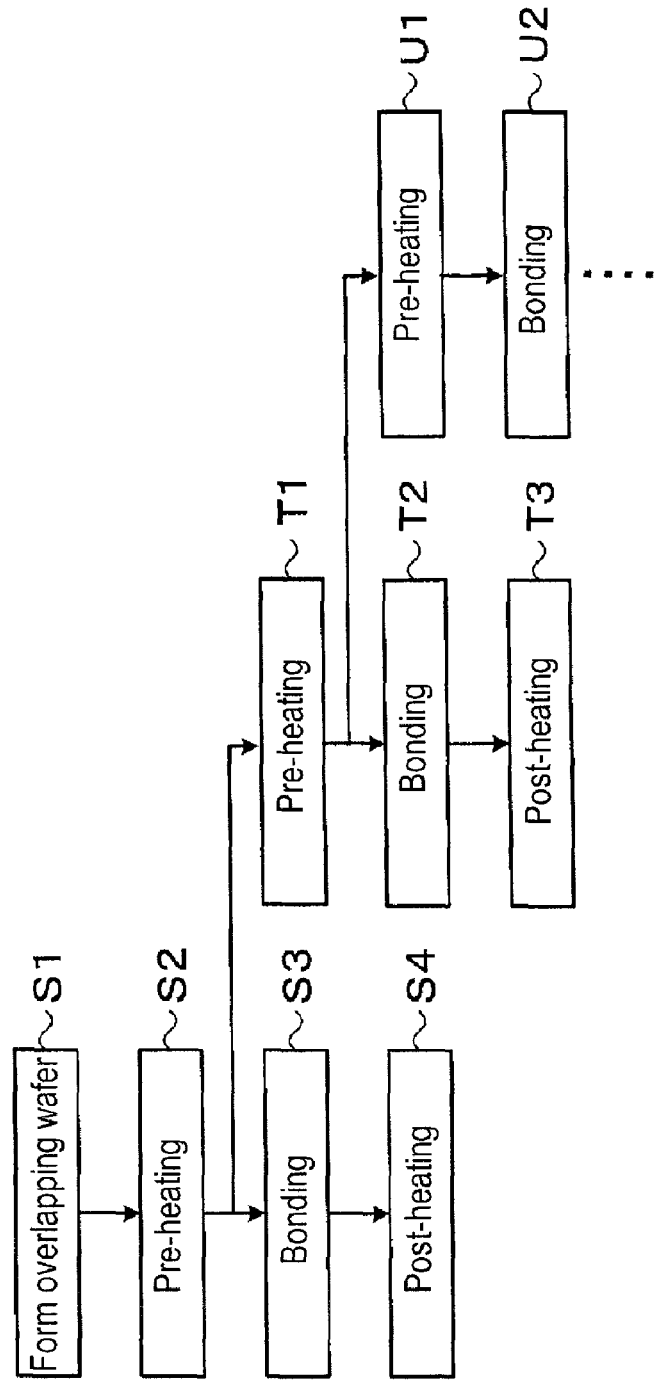
FIG. 20 is a flow chart showing main steps of a wafer bonding process.
Figure 21:
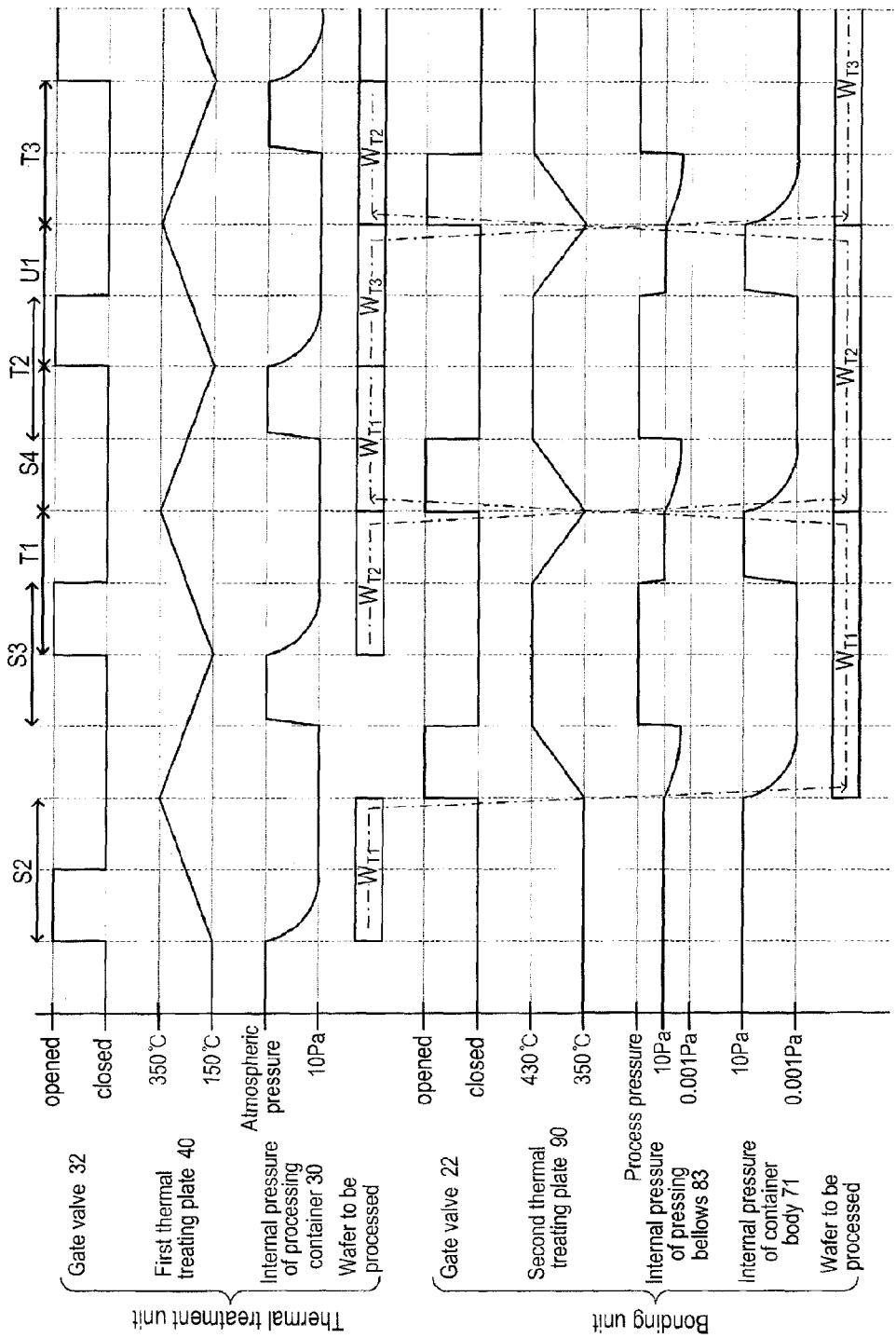
FIG. 21 is a time chart showing an operation state of each device of a bonding apparatus.

Next, a bonding process of the overlapping wafer $W_T$ to be performed using the above-configured bonding system 1 will be described. FIG. 20 is a flow chart showing main steps of the wafer bonding process and FIG. 21 is a time chart showing an operation state of each device of the bonding apparatus 10. FIG. 21 shows temporal changes in heating temperature of the overlapping wafer $W_T$, pressure of compressed air fed into the pressing bellows 83 of the pressing mechanism 80, in other words, load applied to the overlapping wafer $W_T$, pressure of the internal atmosphere of the thermal treatment unit 20, and pressure of the internal atmosphere of the bonding unit 21.

First, the upper wafer $W_U$ and the lower wafer $W_L$ are aligned and overlapped by an external alignment device (not shown). At this time, the adhesive 2 is beforehand coated on one or both of the wafers $W_U$ and $W_L$ before being overlapped, and they are temporarily bonded to form an overlapping wafer $W_{T1}$ (Step S1 in FIG. 20).

Thereafter, the overlapping wafer $W_{T1}$ is carried to the bonding apparatus 10 by means of a wafer carrying apparatus (not shown).

In the bonding apparatus 10, the gate valve 32 of the thermal treatment unit 20 is first opened and the overlapping wafer $W_{T1}$ is carried in the upper part of the first thermal treating plate 40 by means of the wafer carrying apparatus (not shown). Subsequently, the elevating pins 53 are elevated and the overlapping wafer $W_{T1}$ is passed from the wafer carrying apparatus (not shown) to the elevating pins 53. Then, the elevating pins 53 are lowered and the overlapping wafer $W_{T1}$ are mounted on the top of the carrying ring 60 previously mounted on the first thermal treating plate 40. Thereafter, the gate valve 32 is closed and the internal atmosphere of the processing container 30 is decompressed by the vacuum pump 35. Thereafter, the overlapping wafer $W_{T1}$ is heated to a first temperature, for example, 350 degrees Celsius by means of the first thermal treating plate 40 (Step S2 in FIGS. 20 and 21). At this time, the metal bonding portions $J_U$ and $J_L$ of the overlapping wafer $W_{T1}$ are uniformly heated at a predetermined rate of heating, for example, 10 to 50 degrees Celsius/min. At this time, in parallel to the heating by means of the first thermal treating plate 40, heating by means of the upper heating means 41 is performed. Accordingly, the heating is performed such that no difference in temperature occurs between the upper wafer $W_U$ and the lower wafer $W_L$ in the overlapping wafer $W_{T1}$. In addition, the internal pressure of the thermal treatment unit 20 is reduced to a predetermined degree of vacuum, for example, 10 Pa.

Once the overlapping wafer $W_{T1}$ is heated to the first temperature, the gate valve 22 is opened. Subsequently, the overlapping wafer $W_{T1}$ mounted on the first thermal treating plate 40 along with the carrying ring 60 is moved to the bonding unit 21 by means of the carrying mechanism 42 and is mounted on the second thermal treating plate 90 along with the carrying ring 60. Once the overlapping wafer $W_{T1}$ is mounted on the second thermal treating plate 90 along with the carrying ring 60, the carrying mechanism 42 is moved back from the bonding unit 21 to the thermal treatment unit 20 and the gate valve 22 is closed.

Thereafter, the overlapping wafer $W_{T1}$ is heated to a second temperature, for example, 430 degrees Celsius by means of the second thermal treating plate 90. The overlapping wafer $W_{T1}$ is heated at a predetermined rate of heating, for example, 10 to 50 degrees Celsius/min. In addition, after the gate valve 22 is closed, the internal atmosphere of the processing container 70 is reduced to a predetermined degree of vacuum, for example, 0.001 Pa and is kept at that degree of vacuum. At this time, as the internal pressure of the processing container 70 becomes negative, a downward force is exerted on the top plate 72 due to a difference between the pressure applied to the top plate 72 and the internal pressure of the processing container 70, for example. This allows the shield bellows 73 to be contracted such that the pressing adapter 1 and the overlapping wafer $W_{T1}$ approach each other by a predetermined distance. In addition, as shown in FIG. 21, even before compressed air is fed into the pressing mechanism 80, specifically, the pressing bellows 83, under a state where the internal pressure of the processing container 70 is reduced, the internal pressure of the pressing mechanism 80 remains reduced to a predetermined pressure. This is to prevent a load from being applied to the overlapping wafer $W_{T1}$ at an unintended time due to a difference between the internal pressure of the pressing mechanism 80 and the internal pressure of the processing container 70.

Thereafter, with the temperature of the overlapping wafer $W_{T1}$ kept at the second temperature, compressed air is fed to the pressing mechanism 80 to lower the pressing member 81. Accordingly, the lower adapter 85 of the pressing adapter 1 connected to the bottom of the pressing member 81 contacts the overlapping wafer $W_{T1}$ and the overlapping wafer $W_{T1}$ is pressed toward the second thermal treating plate 90 with a predetermined load, for example, 50 kN. When the overlapping wafer $W_{T1}$ is pressed for a predetermined period of time, for example, 10 minutes, the overlapping wafer $W_{T1}$ is bonded (Step S3 in FIGS. 20 and 21). At this time, since the internal atmosphere of the processing container is kept at a negative pressure, an atmosphere between the bonding portions $J_U$ and $J_L$ is suctioned, thereby preventing voids from being generated between the bonding portions $J_U$ and $J_L$. In addition, the temperature of the overlapping wafer $W_{T1}$ may be kept at the second temperature by additionally using a heater within the pressing member 81, or the cooling mechanism 100. In addition, by regulating the amount of compressed air fed into the pressing bellows 83, the temperature of the pressing member 81 may be adjusted to synchronize the temperature of the upper wafer $W_U$ with the temperature of the upper wafer $W_L$ in the overlapping wafer $W_{T1}$.

In parallel to the bonding of the overlapping wafer $W_{T1}$ in the bonding unit 21, a new overlapping wafer $W_{T2}$ is carried in the thermal treatment unit 20 by means of the wafer carrying apparatus (not shown) and is mounted on the first thermal treating plate 40. In carrying the overlapping wafer $W_{T2}$ in the thermal treatment unit 20, the thermal treating plate 40 is cooled to, for example, 150 degrees Celsius in order to make a difference in temperature between the thermal treating plate 40 and the overlapping wafer $W_{T2}$ smaller. Once the overlapping wafer $W_{T2}$ is mounted on the first thermal treating plate 40, the overlapping wafer $W_{T2}$ is heated to a first temperature, for example, 350 degrees Celsius by means of the first thermal treating plate 40 and the upper heating means 41 (Step T1 in FIGS. 20 and 21).

Thereafter, with the overlapping wafer $W_{T1}$ mounted on the second thermal treating plate 90, the overlapping wafer $W_{T1}$ is cooled to the first temperature, for example, 350 degrees Celsius. The overlapping wafer $W_{T1}$ is cooled at a predetermined rate of cooling, for example, 10 to 50 degrees Celsius/min in order to prevent a change in strength and physical properties of the bonding portions $J_U$ and $J_L$. The cooling of the overlapping wafer $W_{T1}$ is performed by elevating the cooling plate 110 of the cooling mechanism 100 and contacting the cooling plate 110 to the bottom of the second thermal treating plate 90.

Once the overlapping wafer $W_{T1}$ is cooled to 350 degrees Celsius, the overlapping wafer $W_{T2}$ mounted on the second thermal treating plate 90 and heated to 350 degrees Celsius is first held by the upper carrying mechanism 42a. Subsequently, the gate valve 22 is opened and the bonded overlapping wafer $W_{T1}$, along with the carrying ring 60, is carried from the second thermal treating plate 90 to the thermal treatment unit 20 by means of the lower carrying mechanism 42b. Subsequently, with the gate valve 22 opened, the overlapping wafer $W_{T2}$ held by the upper carrying mechanism 42a is carried to the bonding unit 21 and is mounted on the second thermal treating plate 90 along with the carrying ring 60.

Subsequently, the upper carrying mechanism 42a is moved back to the thermal treatment unit 20 and the gate valve 22 is closed. Thereafter, the overlapping wafer $W_{T2}$ is heated to the second temperature, for example, 430 degrees Celsius by means of the second thermal treating plate 90 and is pressed and bonded by means of the pressing member 80 and the pressing adapter 1 (Step T2 in FIGS. 20 and 21). In parallel to the pressing of the overlapping wafer $W_{T2}$, in the thermal treatment unit 20, the overlapping wafer $W_{T1}$ held by the upper carrying mechanism 42a is mounted on the first thermal treating plate 40 along with the carrying ring 60.

While the overlapping wafer $W_{T2}$ is being bonded in the bonding unit 21, the overlapping wafer $W_{T1}$ (located in the bonding unit 21) in which bonding has been completed is mounted on the first thermal treating plate 40 and is cooled to a third temperature, for example, 150 degrees Celsius, by means of the first thermal treating plate 40 (Step S4 in FIGS. 20 and 21). At this time, a mixture of dry air and spray-shaped water is fed into the refrigerant passage 44 of the first thermal treating plate 40.

Thereafter, the thermal treatment unit 20 is opened to atmospheric pressure, the elevating pins 53 are elevated, and the overlapping wafer $W_T$ is passed from the first thermal treating plate 40 to the elevating pins 53. Subsequently, the gate valve 32 is opened and the overlapping wafer $W_{T1}$ is passed from the elevating pins 53 to the wafer carrying apparatus (not shown) and is carried out of the bonding apparatus 10.

After the overlapping wafer $W_{T1}$ is carried out of the thermal treatment unit 20, subsequently, with the gate valve 32 opened, a new overlapping wafer $W_{T3}$ is passed to the elevating pins 53 and then is mounted on the first thermal treating plate 40. Then, the overlapping wafer $W_{T3}$ is heated to the first temperature, for example, 350 degrees Celsius, by means of the first thermal treating plate 40 and the upper heating means 41 (Step U1 in FIGS. 20 and 21).

Upon completion of the bonding of the overlapping wafer $W_{T2}$ in the bonding unit 21, the overlapping wafer $W_{T2}$ is cooled to 350 degrees Celsius while being mounted on the second thermal treating plate 90, like the overlapping wafer $W_{T1}$. Subsequently, the overlapping wafer $W_{T3}$ mounted on the second thermal treating plate 90 and heated to 350 degrees Celsius is held by the upper carrying mechanism 42a. Thereafter, the gate valve 22 is opened and the overlapping wafer $W_{T2}$ is carried out of the bonding unit 21 by means of the lower carrying mechanism 42b. Subsequently, with the gate valve 22 opened, the overlapping wafer $W_{T3}$ held by the upper carrying mechanism 42a is carried in the bonding unit 21 and is mounted on the second thermal treating plate 90. Once the overlapping wafer $W_{T3}$ is mounted on the second thermal treating plate 90 of the bonding unit 21, the upper carrying mechanism 42a is moved back to the thermal treatment unit 20 and the gate valve 22 is closed. Thereafter, the overlapping wafer $W_{T3}$ is pressed and bonded by the pressing adapter 1 (Step U2 in FIGS. 20 and 21).

While the overlapping wafer $W_{T3}$ is being bonded in the bonding unit 21, the overlapping wafer $W_{T2}$ mounted on the first thermal treating plate 40 is cooled to the third temperature, for example, 150 degrees Celsius, by means of the first thermal treating plate 40 (Step T3 in FIGS. 20 and 21). Subsequently, the thermal treatment unit 20 is opened to atmospheric pressure, the elevating pins 53 are elevated, and the overlapping wafer $W_{T2}$ is passed from the first thermal treating plate 40 to the elevating pins 53. Subsequently, the gate valve 32 is opened, the overlapping wafer $W_{T2}$ is passed from the elevating pins 53 to the wafer carrying apparatus (not shown) and the overlapping wafer $W_{T2}$ is carried out of the bonding apparatus 10. Thereafter, subsequently, with the gate valve 32 opened, a new overlapping wafer $W_{T4}$ is passed to the elevating pins 53 and then is mounted on the first thermal treating plate 40. Thus, a series of bonding processes of a plurality of overlapping wafers $W_T$ continues to be performed in the single bonding apparatus 10.

According to the above-described embodiment, since the cooling mechanism 100 which cools the second thermal treating plate 90 is disposed below the second thermal treating plate 90 of the bonding unit 21, it is possible to adjust the temperature of the overlapping wafer $W_T$ with high efficiency. That is, when the overlapping wafer $W_T$ is heated to a predetermined temperature by means of the second thermal treating plate 90, when there is excess heating or the predetermined temperature is excessive, the second thermal treating plate 90 can be cooled by elevating and the cooling mechanism 100 to contact the bottom of the second thermal treating plate 90. In addition, since a rate of cooling by the cooling mechanism 100 can be controlled by regulating the amount of air fed to the cooling mechanism 100, it is possible to adjust the temperature of the overlapping wafer $W_T$ with high efficiency.

In addition, as the heater 81a is embedded in the pressing member 81 of the pressing mechanism 80 and by regulating the amount of compressed air fed to the pressing bellows 83 and the amount of compressed air discharged out of the pressing bellows 83, the amount of heat emitted from the heater 81a to the compressed air within the pressing bellows 83 can be controlled to adjust the temperature of the pressing member 81 while maintaining the internal pressure of the pressing bellows 83 at a desired value, thereby allowing synchronization of temperature between the upper wafer $W_U$ and the lower wafer $W_L$ in the overlapping wafer $W_T$. This can prevent strength and other physical properties of the bonding portions from being changed due to a difference in temperature profile between the upper wafer $W_U$ and the lower wafer $W_L$.

Although in the above embodiment the bonding portions $J_U$ and $J_L$ are made of aluminum and germanium, respectively, they may be made of different metal. In this case, the processing conditions in the bonding unit 71, such as heating temperature and pressing load of the overlapping wafer $W_T$, depend on the type of metal used for the bonding portions $J_U$ and $J_L$. In addition, although in the above embodiment the metal bonding portions $J_U$ and $J_L$ are provided in the wafers $W_U$ and $W_L$, the present disclosure may be applied to other various substrates including a metal substrate, a flat panel display (FPD), a mask reticle for photomask and so on.

According to the present disclosure, it is possible to adjust temperature among substrates having metal bonding portions with high efficiency and hence improve a production yield in the substrate bonding process.

More specifically, since the cooling mechanism which cools the thermal treating plate is disposed below the thermal treating plate, it is possible to adjust the temperature of the substrates with high efficiency. That is, when the substrates are heated to a predetermined temperature by means of the thermal treating plate, when a predetermined rate of heating or the predetermined temperature is excessive, the thermal treating plate can be cooled by elevating the cooling mechanism to contact the bottom of the thermal treating plate. In addition, since a rate of cooling by the cooling mechanism can be controlled by regulating the amount of air fed to the cooling mechanism, it is possible to adjust the temperature of the substrates with high efficiency.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A bonding apparatus for bonding substrates having metal bonding portions, the apparatus comprising:
    a processing container having an opening formed on the bottom of the processing container;
    a thermal treating plate disposed within the processing container, the thermal treating plate allowing for substrates to be mounted thereon and allowing for thermal treatment of the substrates;
    a pressing mechanism disposed within the processing container opposite the thermal treating plate and which presses the substrates to the thermal treating plate;
    an annular supporter disposed in an inner side of the processing container along the opening of the processing container, the annular supporter providing an airtight seal between the processing container and the thermal treating plate, and supporting the thermal treating plate; and
    a cooling mechanism disposed in an inner side of the supporter below the thermal treating plate, the cooling mechanism cooling the thermal treating plate,
    wherein the cooling mechanism includes a hollow cooling plate having a top disposed in parallel to the thermal treating plate, a communicating pipe which communicates with the inside of the cooling plate so as to feed air into the cooling plate, and an elevating mechanism which vertically moves the cooling plate,
    a plurality of through holes communicating with the inside of the cooling plate is formed in the bottom of the cooling plate, and
    the air fed from the communicating pipe into the cooling plate is discharged from the through holes of the cooling plate.

2. The bonding apparatus of claim 1, wherein the cooling mechanism further includes a cooling water circulating plate which is disposed below the cooling plate to block the entire surface of the opening of the processing container and contains a cooling water passage which circulates cooling water,
    a plurality of through holes vertically penetrating the cooling water circulating plate is formed in the cooling water circulating plate, and
    the air discharged from the through holes of the cooling plate is discharged from the top to the bottom of the cooling water circulating plate via the through holes of the cooling water circulating plate.

3. The bonding apparatus of claim 1, wherein the pressing mechanism includes an elastic member air-tightly connected to a top plate of the processing container, a pressing member air-tightly connected to the bottom of the elastic member, an air feeding pipe which feeds compressed air into a space surrounded by the top plate of the processing container, the elastic member and the pressing member, and an air discharging pipe which discharges the fed compressed air, and
    a cooling jacket which cools compressed air circulated within the air discharging pipe disposed in the air discharging pipe.

* * * * *